(12) United States Patent
Oh et al.

(10) Patent No.: US 8,725,486 B2
(45) Date of Patent: May 13, 2014

(54) APPARATUS AND METHOD FOR SIMULATING A RECONFIGURABLE PROCESSOR

(75) Inventors: Tae-Wook Oh, Seoul (KR); Soo-Jung Ryu, Hwaseong-si (KR); Yoon-Jin Kim, Seoul (KR); Woong Seo, Hwaseong-si (KR); Young-Chul Cho, Yongin-si (KR); Il-Hyun Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 229 days.

(21) Appl. No.: 13/012,945

(22) Filed: Jan. 25, 2011

(65) Prior Publication Data

US 2011/0246170 A1 Oct. 6, 2011

(30) Foreign Application Priority Data

Mar. 31, 2010 (KR) .................. 10-2010-0029379

(51) Int. Cl.
*G06F 17/50* (2006.01)

(52) U.S. Cl.
CPC ........ *G06F 17/5054* (2013.01); *G06F 17/5022* (2013.01); *G06F 17/5077* (2013.01)
USPC ................. 703/21; 703/15; 716/126

(58) Field of Classification Search
None
See application file for complete search history.

(56) References Cited

U.S. PATENT DOCUMENTS

| | | | |
|---|---|---|---|
| 5,841,967 A | 11/1998 | Sample et al. | |
| 6,421,808 B1 * | 7/2002 | McGeer et al. | 716/100 |
| 7,054,802 B2 | 5/2006 | Ohkami | |
| 7,234,125 B1 * | 6/2007 | Scott et al. | 716/102 |
| 7,366,651 B1 | 4/2008 | Milne et al. | |
| 7,380,232 B1 * | 5/2008 | Schumacher et al. | 716/104 |
| 7,698,118 B2 * | 4/2010 | Reblewski | 703/13 |
| 7,979,759 B2 * | 7/2011 | Carnevale et al. | 714/718 |
| 8,265,917 B1 * | 9/2012 | Ou et al. | 703/14 |

(Continued)

FOREIGN PATENT DOCUMENTS

| | | |
|---|---|---|
| KR | 10-1998-0032933 | 7/1998 |
| KR | 10-2003-0066641 | 8/2003 |
| KR | 10-2006-0120079 | 11/2006 |
| WO | WO 2007/106959 A2 | 9/2007 |

OTHER PUBLICATIONS

Rau, B. Ramakrishna "Iterative Modulo Scheduling" Int. J. Parallel Processing, vol. 21, No. 1 (1996) available from <http://www.hpl.hp.com/techreports/94/HPL-94-115.html>.*

(Continued)

*Primary Examiner* — Kamini S Shah
*Assistant Examiner* — Jay B Hann
(74) *Attorney, Agent, or Firm* — NSIP Law

(57) ABSTRACT

A processor simulation technique to evaluate the performance of a processor that executes application programs is provided. The processor simulation technique may be used to optimize the execution of an application program. A simulator of a reconfigurable processor including a plurality of functional units models a processor by representing routing paths between functional units that generate operands and functional units that consume the operands. The size of each queue may be decided based on information regarding routing delays between functional units and stage information of iteration loops according to modulo scheduling received from a scheduler. A modeling code DB that stores host-oriented binary codes for operations of routing queues is also provided. The simulation may be performed by executing a host-directed binary code corresponding to a binary file instead of the binary file.

21 Claims, 8 Drawing Sheets

(56) References Cited

U.S. PATENT DOCUMENTS

| | | | |
|---|---|---|---|
| 2001/0025363 A1* | 9/2001 | Ussery et al. | 716/1 |
| 2002/0059054 A1* | 5/2002 | Bade et al. | 703/20 |
| 2002/0133325 A1 | 9/2002 | Hoare, II et al. | |
| 2003/0149962 A1 | 8/2003 | Willis et al. | |
| 2004/0226000 A1* | 11/2004 | Finch | 717/114 |
| 2006/0277020 A1 | 12/2006 | Ganesan et al. | |
| 2008/0077382 A1 | 3/2008 | Strehl | |
| 2010/0057426 A1* | 3/2010 | Reblewski | 703/14 |
| 2011/0218795 A1* | 9/2011 | Cho et al. | 703/21 |

OTHER PUBLICATIONS

Brito, Alisson V. et al. "A General Purpose Partially Reconfigurable Processor Simulator (PReProS)" IEEE (2007) available at <http://ieeexplore.ieee.org/stamp/stamp.jsp?arnumber=04228103>.*

European Search Report issued on Jun. 27, 2011, in counterpart European Patent Application No. 11154723.8 (8 pages).

Binggend Mei, et al. "Architecture Exploration for a Reconfigurable Architecture Template", IEEE Design & Test of Computers, IEEE Service Center, New York, NY, US, vol. 22, No. 2, Feb. 1, 2005, pp. 90-101.

Dimitroulakos G, et al. "Resource aware mapping on coarse grained reconfigurable arrays", Microprocessors and Microsystems, IPC Business Press Ltd. London, GB, vol. 33, No. 2, Mar. 1, 2009, pp. 91-105.

Frank Bouwens, et al. "Architecture Enhancements for the ADRES Coarse-Grained Reconfigurable Array", Jan. 28, 2007, Third International Conference on High-Performance Embedded Architectures and Compilers (HIPEAC 2008). Goteborg, Sweden, Jan. 27, 2008-Jan. 29, 2008, Springer Berlin Heidelberg, Berlin, Heidelberg, pp. 66-81.

* cited by examiner

APPARATUS AND METHOD FOR SIMULATING A RECONFIGURABLE PROCESSOR

CROSS-REFERENCE TO RELATED APPLICATION

This application claims the benefit under 35 U.S.C. §119(a) of Korean Patent Application No. 10-2010-0029379, filed on Mar. 31, 2010, the entire disclosure of which is incorporated herein by reference for all purposes.

BACKGROUND

1. Field

The following description relates to a processor simulation technology that simulates the performance of a processor executing application programs and which may be used to improve the processing of an application program.

2. Description of the Related Art

The concept of reconfigurable computing is based on the arrangement of a processor along with an array of reconfigurable hardware elements. The behavior of such reconfigurable hardware elements, including data flow between the reconfigurable hardware elements, may be tailored to perform a specific task. A reconfigurable processor may have a processing performance that is the same as the performance of dedicated hardware.

A reconfigurable array includes a plurality of processing elements or functional units. The size of such a functional unit or the complexity of a functional unit, for example, the number of ALUs or registers that are included in a functional unit, is referred to as granularity. A processor whose granularity is larger may be referred to as a Coarse-Grained Reconfigurable Architecture (CGRA), and a processor whose granularity is smaller may be referred to as a Fine-Grained Reconfigurable Architecture. The configuration between individual functional units may be dynamically set when a specific task is performed based on configuration information. For example, a routing path between individual functional units may be dynamically established based on configuration information that may be read from a configuration memory, for example, by a multiplexer. An execution file may be executed based on the established architecture. Instructions of an execution file may be stored in an instruction memory. The instructions may be in the form of a sequence of instruction codes and operand information which are to be executed by respective processing elements.

A CGRA may be implemented as an accelerator that may be used to improve the execution speed of a particular section of a program, for example, an iteration loop. In comparison with existing Application-Specific Integrated Circuits (ASIC), CGRA processors are being targeted as an efficient means for a next-generation digital signal processor (DSP) because they have a high degree of flexibility and a performance level that is similar to the ASIC.

In order to estimate the degree of performance that a certain application program can obtain using a CGRA-based platform and to correct source codes to more efficiently use the CGRA, a simulator that allows performance debugging may be used. A simulator for CGRA should have sufficiently high speed such that simulation does not become the bottleneck of software development. In addition, the simulator should ensure a cycle accuracy for accurate performance debugging.

Because the CGRA decides all schedules during a compile time, like a Very Long Instruction Word (VLIW) machine, a simulator may ensure a cycle accuracy. However, unlike a general processor that performs all operands passing between functional units through a register, the CGRA passes operands between functional units using significantly complicated interconnection logics. For this reason, the simulator is burdened with having to model the operations of the numerous interconnection logics. Monitoring the large amount of interconnections is a main factor that limits simulation speed.

SUMMARY

In one general aspect, there is provided a simulator of a reconfigurable processor, comprising a processor modeling unit to produce a processor model comprising a queue that represents a routing path between a functional unit producing an operand and a functional unit consuming the operand, wherein the processor model is based on routing delays between functional units and stage information of iteration loops based on modulo scheduling, and a simulation unit to simulate a binary file received from a compiler based on the processor model produced by the processor modeling unit and to output the result of the simulation.

The queue represented by the processor modeling unit may have a number of slots corresponding to a ratio of a routing delay on the routing path and corresponding to an initiation interval of a stage.

The simulation unit may write an operand produced in each functional unit to a first slot of a corresponding queue, and may shift the information written in each slot to a next slot at each initiation interval.

The binary file received from the compiler may include a configuration file and an execution file.

The simulator may further comprise a modeling code DB to store host-oriented binary codes for operations of routing queues, wherein the simulation unit performs simulation by reconfiguring interconnections of routing queues from the host-oriented binary codes extracted from the modeling code DB.

In another aspect, there is provided a simulation method of a reconfigurable processor, comprising producing a processor model comprising a queue that represents a routing path between a functional unit producing an operand and a functional unit consuming the operand, wherein the processor model is based on routing delays between functional units and stage information of iteration loops based on modulo scheduling, and simulating a binary file received from a compiler based on the processor model produced by the modeling unit and to output the result of the simulation.

The queue represented in the producing of the processor model may have a number of slots corresponding to a ratio of a routing delay on the routing path and corresponding to an initiation interval of a stage.

The simulating of the binary file may comprise writing an operand produced in each functional unit to a first slot of a corresponding queue and shifting information written in each slot to an adjacent slot at each initiation interval.

The stage information may include stage division information of an iteration and is information about the relationship between functional units assigned to individual stages, functional units which produce operands, and functional units which consume the operands.

The binary file received from the compiler may include a configuration file and an execution file.

The simulating of the binary file may comprise performing a simulation by reading the binary file, extracting a host-oriented binary code corresponding to the binary file from a modeling code DB which stores host-oriented binary codes for operations of routing queues, and executing the host-oriented binary code.

In another aspect, there is provided a computer-readable storage medium having stored therein program instructions to cause a processor to implement a simulation method of a reconfigurable processor, the simulation method comprising producing a processor model comprising a queue that represents a routing path between a functional unit producing an operand and a functional unit consuming the operand, wherein the processor model is based on information routing delays between functional units and stage information of iteration loops based on modulo scheduling, and simulating a binary file received from a compiler based on the processor model produced by the modeling unit and to output the result of the simulation.

In another aspect, there is provided a simulator of a reconfigurable processor, comprising a processor modeling unit which generates an abstracted architecture model that represents a routing path between functional units that produce operands and functional units that consume operands, wherein the abstracted architecture model is based on routing delays between functional units and stage information of iteration loops based on modulo scheduling, and a simulation unit to simulate a binary file based on the abstracted architecture model produced by the processor modeling unit and to output the result of the simulation.

The binary file may comprise configuration information that includes information about is how functional units of the reconfigurable processor are mapped in order to execute a specific application program.

The binary file may comprise an execution file that includes instructions that are executed by respective functional units in the reconfigurable processor based on the functional units having a fixed structure during a predetermined time period.

The abstracted architecture model may comprise a queue which maps a functional unit that produces an operand to a functional unit that consumes the operand.

A functional unit f1 may produce an operand at a time t1, and the queue may connect the destination port of the functional unit f1 with the source port of a functional unit f2 that consumes the operand.

The processor modeling unit may update the abstracted architecture model based on scheduling information of the functional units, and the scheduling information is received from a scheduler.

Other features and aspects may be apparent from the following description, the drawings, and the claims.

BRIEF DESCRIPTION OF THE DRAWINGS

Throughout the drawings and the description, unless otherwise described, the same drawing reference numerals should be understood to refer to the same elements, features, and structures. The relative size and depiction of these elements may be exaggerated for clarity, illustration, and convenience.

DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. Also, descriptions of well-known functions and constructions may be omitted for increased clarity and conciseness.

Figure 1:
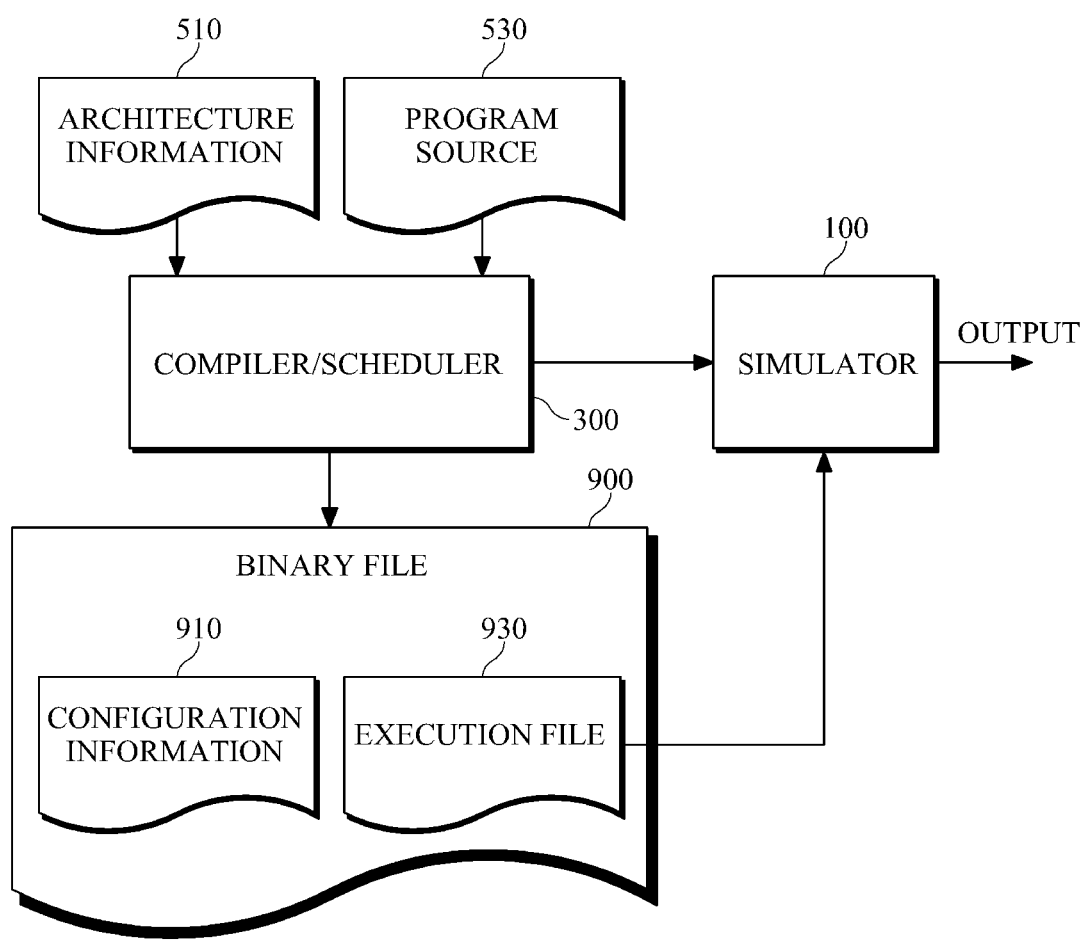
FIG. 1 is a diagram illustrating an example of a program development system that may be used to simulate a reconfigurable processor.

FIG. 1 illustrates an example of a program development system that may be used to simulate a reconfigurable processor. Referring to FIG. 1, the program development system includes a compiler/scheduler 300 and a simulator 100. The compiler/scheduler 300 reads architecture information 510 of a reconfigurable processor and a program source 530 that is to be executed based on the architecture information 510. The compiler/scheduler 300 compiles and is schedules the architecture information 510 and program source 530 and then stores the results of the scheduling as an execution file 930 and configuration information 910 in a memory. The simulator 100 receives scheduling information from the compiler/scheduler 300, reads the configuration information 910 and execution file 930 from the memory, and simulates an execution of the execution file 930.

For example, the program development system may be included in a mobile device or a home device. For example, the program development system may be included in a mobile terminal device, an embedded system, and the like. The simulator 100 may be used to simulate the processing performed by a single core processor or a multi-core processor.

In the example of FIG. 1, a binary file 900 transferred from the compiler/scheduler 300 to the simulator 100 includes configuration information 910 (or a configuration file) and an execution file 930.

Through the simulation, the degree of attainable performance of a certain application program executed in a reconfigurable process with a given architecture may be estimated and also the program source 530 may be corrected through debugging to achieve more efficient execution. The architecture information 510 may include, for example, information regarding the architecture of functional units of the reconfigurable processor, a data architecture such as path interconnection data between the functional units, an architecture of control flow, and the like. The configuration information 910 may include information about how path interconnections between the functional units of the reconfigurable processor are structured to execute an application program. The execution file 930 may include instructions that are executed by the respective functional units in the reconfigurable processor based on the functional units having a fixed structure during a predetermined time period that is based on the is configuration information 910. The configuration information 910 and instruction codes may be integrated with each other and handled together. For example, configuration information and instruction codes that have to be processed in one clock cycle may be stored in memory in such a manner as to be adjacent to each other so that they may be simultaneously fetched by the processor.

In the program development system, the simulator 100 may receive information related to scheduling from the compiler/scheduler 300. As another example, the scheduling information may be stored in the memory 900 and may be read by the simulator 100 from the memory 900.

As an example, the simulator 100 may use an abstracted architecture model. As described herein, the abstracted architecture model models operand routing paths between functional units as queues. The abstracted architecture may model routing paths between a functional unit which produces an operand and a functional unit which consumes the operand, instead of representing the operand routing paths using a sequence of actual interconnection logics. Accordingly, simulation speed may be enhanced because the number of interconnection components whose operations have to be checked in each simulation cycle is greatly reduced.

Figure 2:
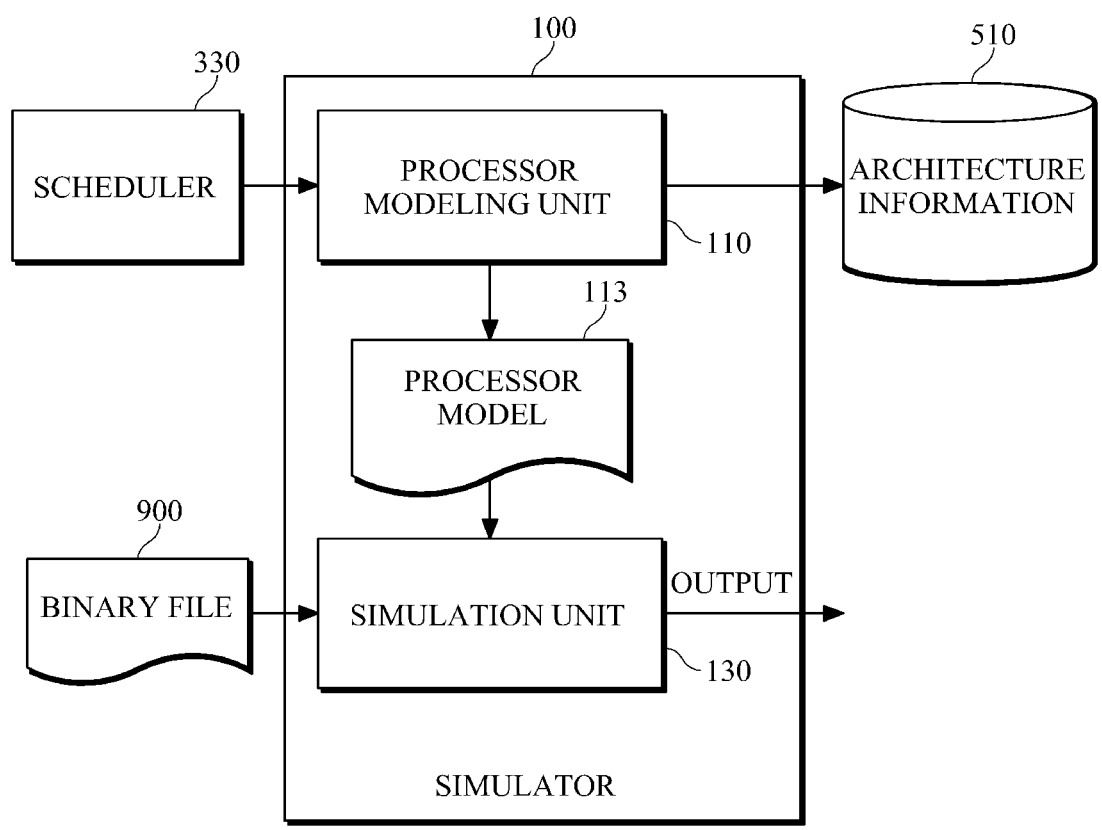
FIG. 2 is a diagram illustrating an example of a reconfigurable processor with a simulator.

FIG. 2 illustrates an example of a reconfigurable processor with a simulator. As illustrated in FIG. 2, the simulator 100 includes a processor modeling unit 110 and a simulation unit 130. The processor modeling unit 110 models a processor by representing routing paths between a functional unit which produces an operand and a functional unit which consumes the operand, as a queue. The processor modeling unit 110 may model the processor based on information about routing delays between functional units and stage information of iteration loops based on modulo scheduling information received from a scheduler. The simulation unit 130 simulates a binary file received from a compiler. The simulation unit 130 simulates the binary file based on a processor model 113 produced by the processor modeling unit 110 and is outputs the results of the simulation.

As shown in the example illustrated in FIG. 2, the processor modeling unit 110 and the simulation unit 130 may be implemented in programs. Also, the processor model 113 and/or architecture information 510 may be data or a data structure stored in memory.

In a Coarse-Grained Reconfigurable Architecture (CGRA), the processor has interconnection logics between functional units that are sparse. As a result, there may be no direct path for routing a certain operand in one cycle between the functional units existing in an architecture. Accordingly, the CGRA processor generally utilizes two or more interconnection components to route one operand. For example, a value produced by a certain functional unit may pass through a register file, a multiplexer, other functional units, and the like, sequentially in order to be routed to the appropriate functional unit. Subsequently, the value may be transferred to a functional unit to consume the value. The scheduler of the CGRA processor may determine what operation has to be placed into each functional unit during a compile time. In addition, the CGRA processor may determine which chain of interconnection components has to be used to route operands between operations.

As described herein, the processor model 113 models operand routing paths between functional units, as a queue. For example, the processor model 113 may model routing paths between a functional unit which produces an operand and a functional unit which consumes the operand, instead of addressing the operand routing path using a sequence of interconnection logics. For example, when an arbitrary operand is produced by a functional unit f1 at a time t1 and then consumed by a functional unit f2 at a time t2, a queue may be modeled which connects the destination port of the functional unit f1 at the t1 time to the source port of the functional unit f2 at the t2 time.

Figure 4:
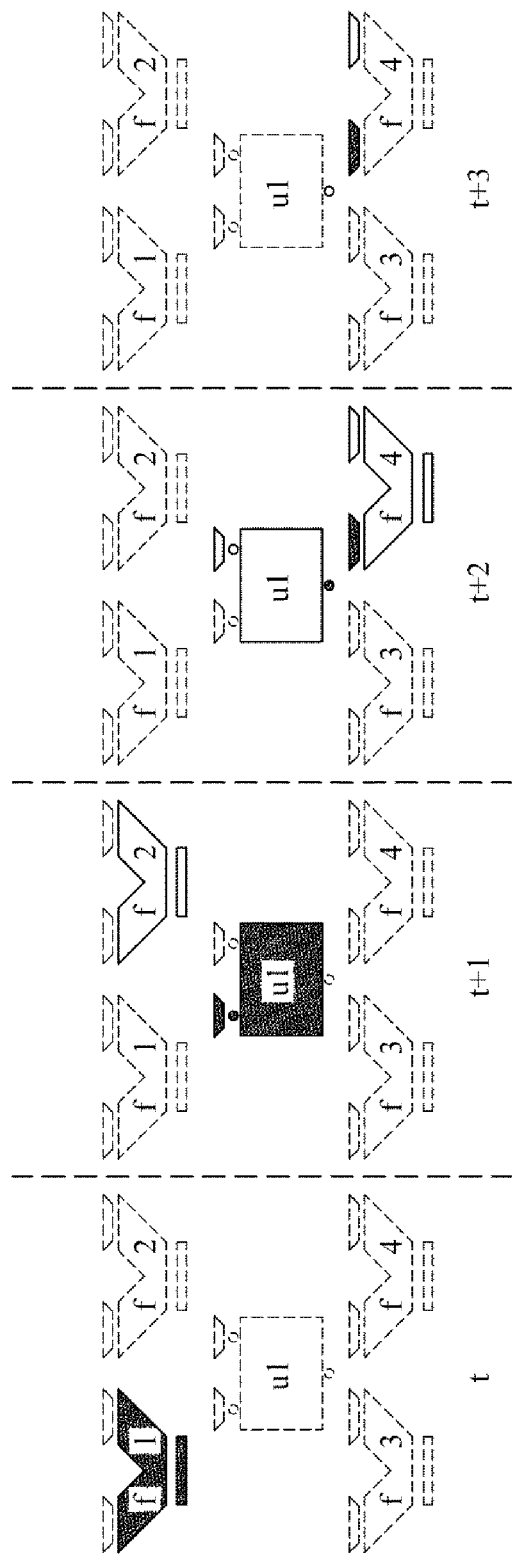
FIG. 4 is a diagram illustrating an example of a conventional architecture model.

FIG. 4 illustrates an example of a conventional architecture model. In FIG. 4, areas is denoted by dotted lines are areas where no meaningful operands exist, areas filled in black illustrate the flow of an operand produced by the functional unit f1, and areas denoted by solid lines illustrate the flow of an operand produced by the functional unit f2. For example, the functional units f1 through f4 may be Arithmetic Logical Units (ALUs) and a functional unit u1 may be a local register file.

At the time t1, a first operand produced by the functional unit f1 reaches an output buffer of the functional unit f1. At time t+1, the first operand reaches an input buffer of the functional unit u1 to be latched therein and simultaneously a second operand produced by the functional unit f2 reaches an output buffer of the functional unit f2. At time t+2, the first operand produced by the functional unit f1 reaches the output buffer of the functional unit u1 to be latched in the left input buffer of the functional unit f4, and also the second operand produced by the functional unit f2 reaches the functional buffer of the functional unit u1 to be latched therein. At time t+3, the operand latched in the functional unit u1 reaches the output buffer of the functional unit u1 and is latched in the right input buffer of the functional unit f4.

As shown in this example, the first operand produced by the functional unit f1 at the time t reaches the functional unit f4 via the functional unit u1 at the time t+2 and is ready to be consumed. The second operand produced by the functional unit f2 at the time t+1 reaches the functional unit f4 via the functional unit u1 at the time t+3 and is ready to be consumed. Hence, the operations of the two operands are performed at the time t+3 by the functional unit f4. Accordingly, the first operand output by the functional unit f1 needs three clock cycles until the first operand is consumed in the functional unit f4, and the second operand output by the functional unit f2 needs two clock cycles until the operand is consumed in the functional unit f4. That is, the first operand is ready to be consumed at time t+2, but the first operand is not consumed until time t+3 when the second operand is also ready to be consumed.

Figure 5:
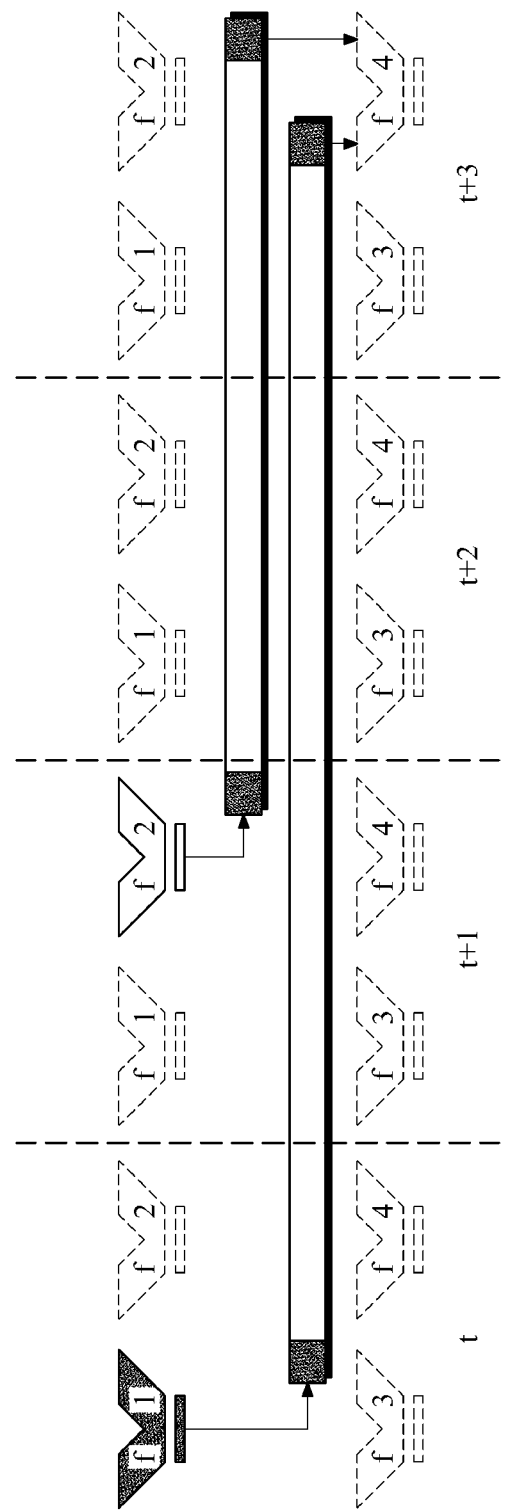
FIG. 5 is a diagram illustrating an example of a modeling method that may be applied to is a processor.

FIG. 5 illustrates an example of a modeling method that may be applied to a processor. In FIG. 5, the input buffers of the functional units f1 through f4 are omitted and the local register file (u1 of FIG. 4) is modeled as queues that have slots corresponding to a degree of delay. The operand routing queues exist for the purpose of transferring only meaningful operands. As a result, a simulator considers only queues corresponding to meaningful operands as interconnection components for routing the operands. By considering only meaningful operands, the number of interconnection components having to be considered every cycle is reduced, resulting in a reduction of a simulation time.

As shown in FIG. 5, the simulator simulates the processing of a reconfigurable processor array including four functional units. However, this is merely for purposes of example. The reconfigurable processor array may include a plurality of functional units, for example, two units, four units, eight units, twelve units, sixteen units, twenty four units, or more.

In order to update a dataflow graph to produce an architecture model, information about how the dataflow graph is mapped to the architecture may be used. For example, the information may be supplied from a scheduler. The scheduler may produce scheduling information for a source operation and a destination operation of components that exist on a dataflow and may provide the scheduling information to the simulator.

Scheduling for a CGRA processor may include a list scheduling framework and a Modulo scheduling framework. For example, in the list scheduling framework, a routing queue may be implemented as a buffer. That is, a routing queue may be implemented by allowing a component which produces an operand to write a value in a buffer when producing the value, and allowing a component which consumes the operand to read the value from the buffer when consuming the value.

Modulo scheduling corresponds to software pipelining. Modulo scheduling is a form of instruction scheduling that interleaves different iterations of a loop. Software pipelining improves performance by overlapping the execution of different iterations of a loop. An iteration can start executing before completions of previous iterations. The interval at which iterations are started is called the initiation interval. One goal of the software pipelining optimization is to find a schedule that overlaps iterations and uses the shortest possible initiation interval.

Figure 6:
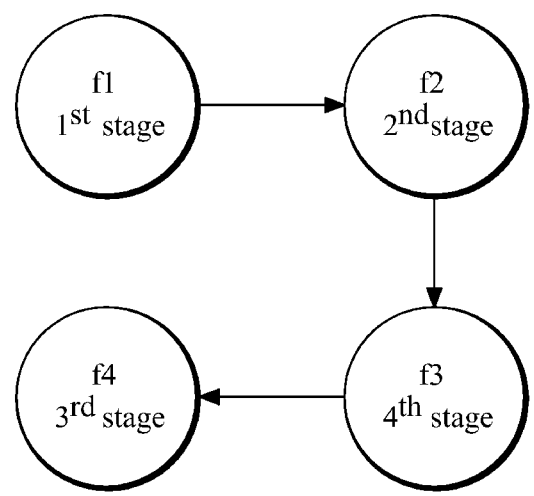
FIG. 6 is a diagram illustrating an example of modulo scheduling with a Coarse-Grained Reconfigurable Architecture (CGRA) processor.
Figure 7:
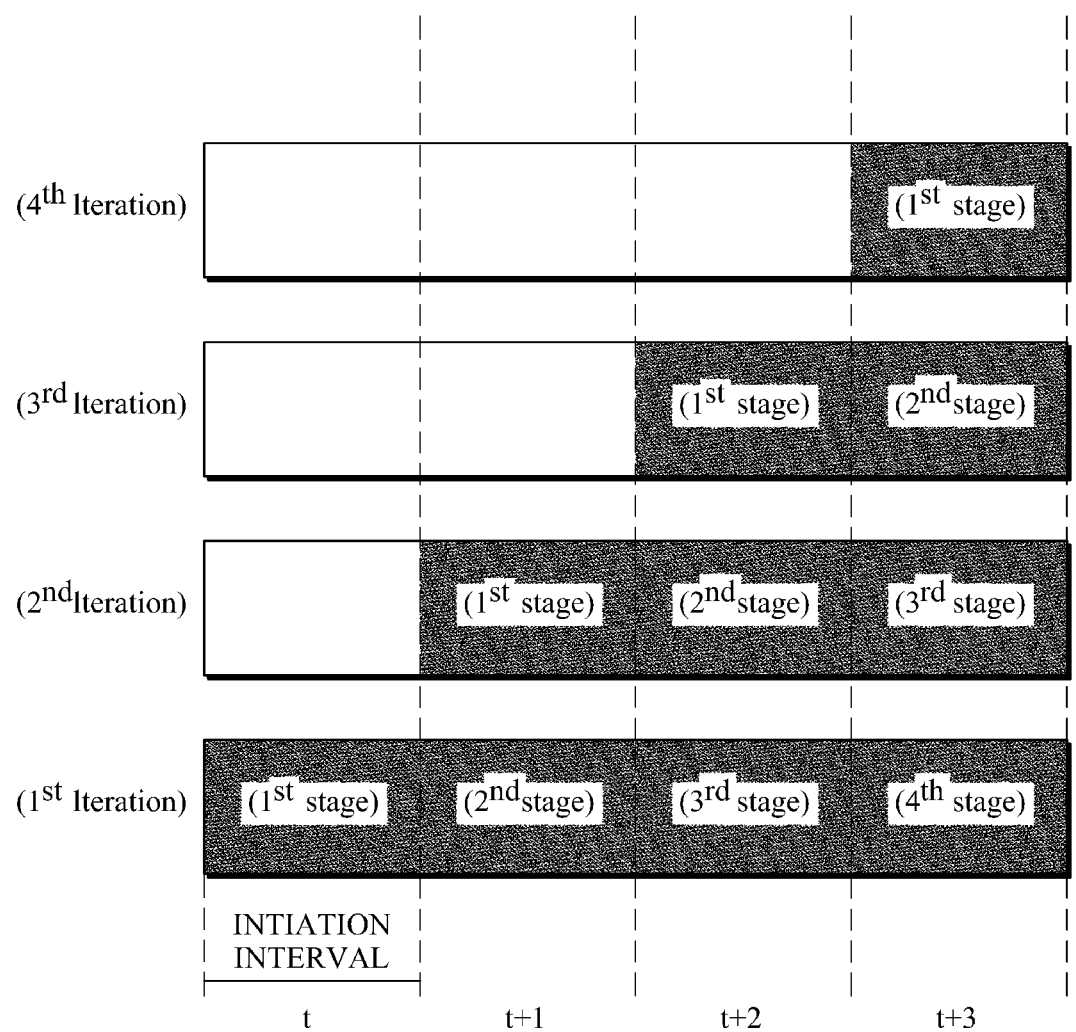
FIG. 7 is a diagram illustrating an example of a processing flow of individual functional units when the CGRA processor of FIG. 6 executes an iteration loop consisting of four stages.

The Modulo scheduling framework may produce an overlapped schedule in which a plurality of loop iterations are executed while overlapping. In the produced schedule, an iteration is divided into a plurality of stages and each stage has an execution cycle corresponding to the initiation interval. In each initiation interval cycle, operations corresponding to different stages from different loop iterations are scheduled in an overlapped manner. Consequently, for the Modulo scheduling framework, the schedule is produced so as to perform the same operation repeatedly included in different iterations at every initiation interval. Because the iterations of a loop are overlapped, and if the number of cycles consumed by the operand routing path exceeds the initiation interval, the value contained in the queue may be overwritten and may vanish before the component to consume the value can reach it FIG. 6 illustrates an example of modulo scheduling with a CGRA processor. FIG. 7 illustrates a processing flow of individual functional units f1 through f4 when the CGRA processor of FIG. 6 executes an iteration loop consisting of four stages. Each of the four functional units f1 through f4 illustrated in FIG. 6 is in charge of execution of one stage consisting of an iteration, and performs processing based on software pipelining to process data received from the previous stage and then output the processed data to the next stage.

Referring to FIG. 7, at time t, the functional unit f1 processes a first stage of a first iteration loop, and the functional loops f2, f3, and f4 wait for the results of processing from the is previous steps. At time t+1, the functional unit f1 processes a first stage of a second iteration loop, the functional unit f2 receives the processing result on the first stage of the first iteration loop from the functional unit f1 and processes a second stage of the first iteration loop, and the functional units f3 and f4 continue to wait for the results of processing from the previous steps. At time t+2, the functional unit f1 processes a first stage of a third iteration loop, the functional unit f2 receives the results of the processing on the first stage of the second iteration loop from the functional unit f1 and processes the second stage of the second iteration loop, and the functional unit f3 receives the results of the processing on the second stage of the first iteration loop from the functional unit f2 and processes a third stage of the first iteration loop, and the functional unit f4 continues to wait for the results of processing from the previous step. At time t+3, the functional unit f1 processes a first stage of a fourth iteration loop, the functional unit f2 receives the results of the processing on the first stage of the third iteration loop from the functional unit f1 and processes a second stage of the third iteration loop, the functional unit f3 receives the results of the processing on the second stage of the second iteration loop from the functional unit f2 and processes a third stage of the second iteration loop, and the functional unit f4 receives the results of the processing on the third stage of the first iteration from the functional unit f3 and processes the fourth stage of the first iteration loop.

In the example shown in FIG. 7, each clock cycle corresponds to an initiation interval. The first clock cycle corresponds to the first initiation interval, the second clock cycle corresponds to the second initiation interval, the third clock cycle corresponds to the third initiation interval, and the fourth clock cycle corresponds to the fourth initiation interval.

Accordingly, if a routing queue is implemented as a single buffer when simulating the results produced in the modulo scheduling framework using the processor model according to the current example, and if the number of cycles consumed by the operand routing path exceeds is the initiation interval, the value contained in the queue is overwritten and vanishes before the component to consume the value can reach it. This is because the component which produces the operand writes a new value in the routing queue at every initiation interval.

As described herein, a queue defined by the processor modeling unit 110 (shown in FIG. 2) may have a number of slots that corresponds to a ratio of a routing delay on the corresponding routing path and an initiation interval of a stage. The simulation unit 130 (shown in FIG. 2) may write an operand produced in each functional unit in a first slot of the corresponding queue and may shift information recorded in each slot to a next slot at each initiation interval. For example, when simulation is performed in the Modulo scheduling framework, a routing queue may be implemented to be as many slots as a number corresponding to a ceiling value. For example, a ceiling value may be determined by dividing a routing delay by an initiation interval. The routing queue shifts a value recorded in a slot to a next slot at every initiation interval and a component which consumes the operand reads a value recorded in the final slot of the routing queue.

Figure 8:
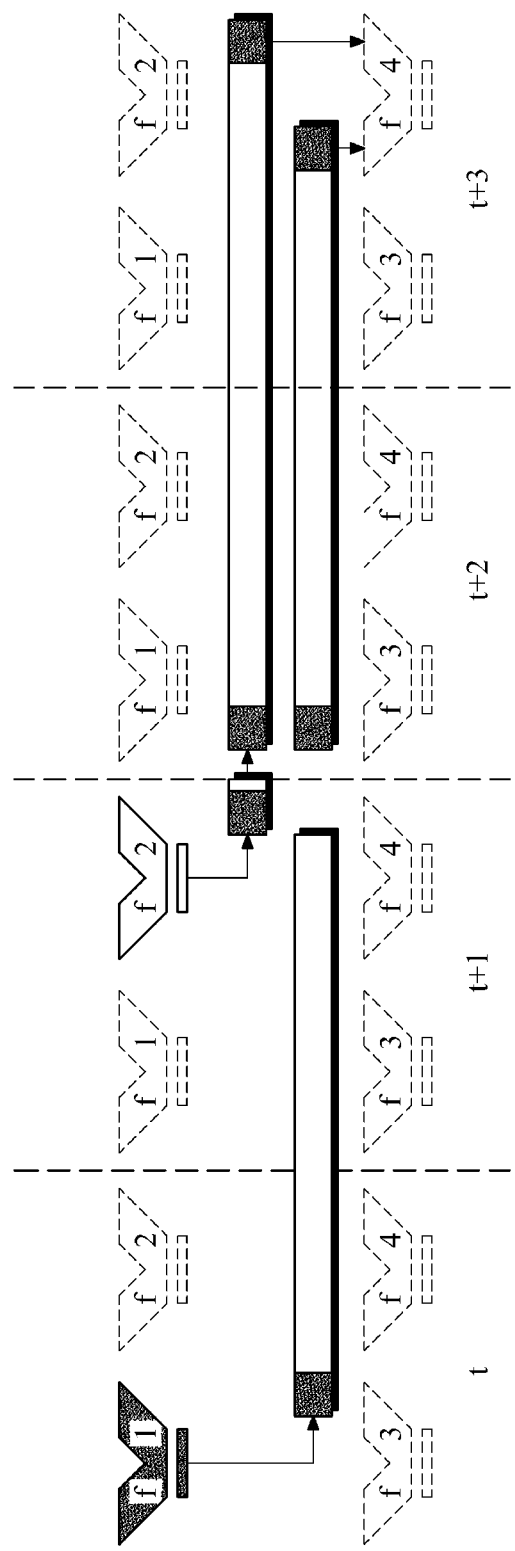
FIG. 8 is a diagram illustrating an example of a processor model that can be applied to modulo-scheduled results.

FIG. 8 illustrates an example of a processor model 113 that may be applied to modulo-scheduled results. In this example, the initiation interval has been scheduled to be 2 cycles. Because the two operands shown in FIG. 8 both have routing delays greater than the initiation interval, a routing queue corresponding to each operand is divided into two slots. As described above, because functional units produce new values at every initiation interval, the simulation unit 130 shifts the previously produced value to the next slot of the corresponding routing queue when an initiation interval elapses. As such, by managing a routing queue for each operand, the simulation unit 130 may model operations for modulo-scheduled results.

Figure 3:
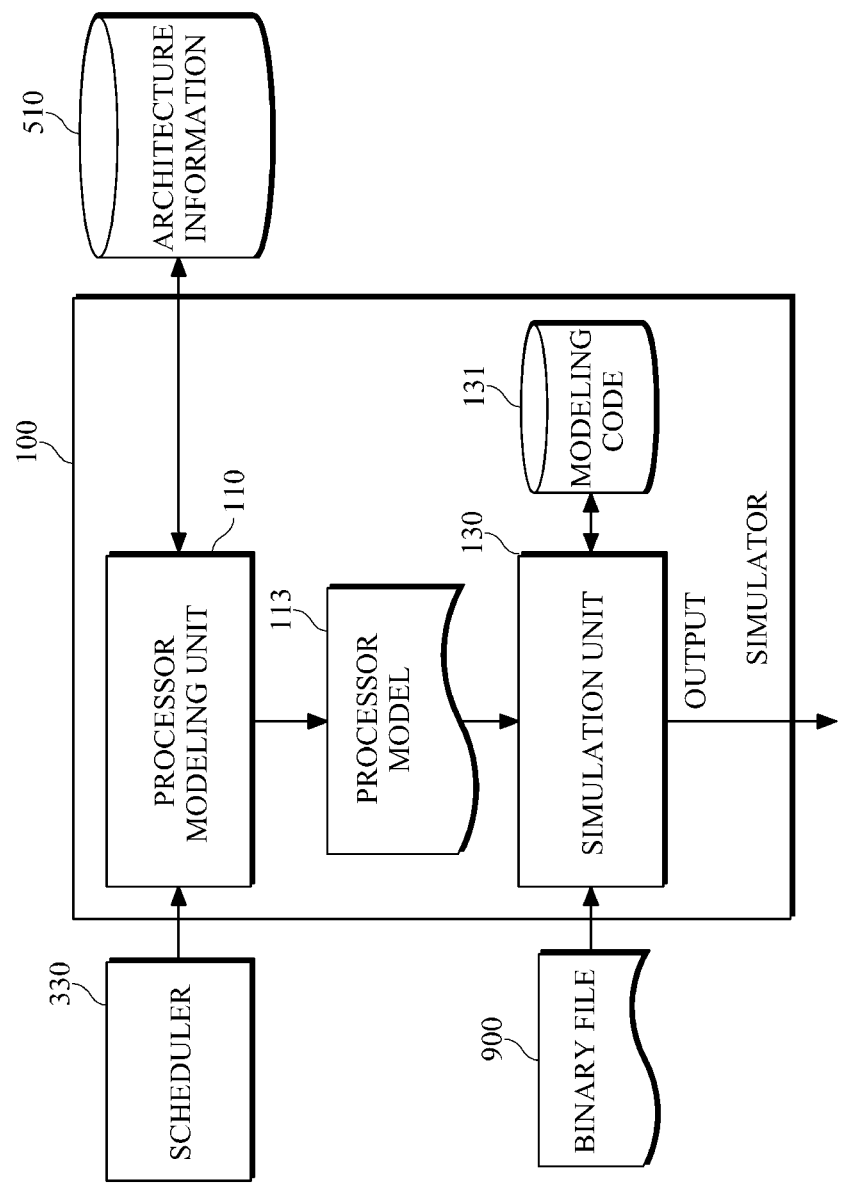
FIG. 3 is a diagram illustrating another example of a reconfigurable processor with a simulator.

FIG. 3 illustrates another example of a reconfigurable processor with a simulator. Referring to FIG. 3, the simulator 100 may further include a modeling code data base (DB) 131 is that stores host-oriented binary codes for operations of routing queues. In this example, the simulation unit 130 may read a binary file 900 and may extract a host-oriented binary code corresponding to the binary file 900 from the modeling code DB 131 to execute the host-oriented binary code, thereby performing a simulation. As another example, the simulator 100 may perform simulation by reconfiguring interconnections of routing queues from host-oriented binary codes extracted from the modeling code DB 131. In the example illustrated in FIG. 3, a scheduler 330, a processor modeling unit 110, architecture information 519, and a processor model 113 correspond to elements with like reference numbers illustrated in FIG. 2.

Binary translation may be used to increase simulation speed by substituting a binary instruction of a machine targeted on a simulator with a binary of a host machine performing the equivalent operation with the targeted machine. Accordingly, the substituted binary of the host machine may be executed upon simulation of the equivalent code block.

Like a general processor which reads a value from an instruction memory, corresponding to an address indicated by a program counter, and performs the corresponding operation, a CGRA processor may read configuration information from a specific address of a configuration memory at every cycle to perform an operation indicated by the configuration information of the corresponding cycle for each component. For example, a host binary code for configuration information may be produced for each address of a configuration memory. Thereafter, when simulation for configuration information existing at the same address of the configuration memory is performed, the simulation may be performed using the previously produced binary code.

In the example illustrated in FIG. 3, a binary translation technique is applied to the processor model 113. For example, binary codes modeling the operations of routing queues are stored, instead of producing host binary codes to represent the behaviors of interconnection logics actually existing on processor architecture. In this example, binary codes modeling the operations of the routing queues may be stored instead of host binary codes related to the behaviors of interconnection logics existing in the real processor architecture. For example, components whose operations are mapped into a data flow graph may be described as utilizing routing queues instead of being described as exchanging the produced or consumed value through interconnection logics. Meanwhile, in regard to the operation of the routing queue, the shifting of values existing in routing queues to the next slots whenever an initiation interval elapses is all that needs to be modeled, which leads to easy application of binary translation.

In the example illustrated in FIG. 3, the modeling code DB 131 may store a host binary code for configuration information in correspondence to each address of a configuration memory. The configuration information is information that describes the operations of routing queues between components on a dataflow graph. The simulation unit 130 may reconfigure a processor model 113 based on the host binary code read from the modeling code DB 131, and may read an execution file from a binary file 900 to perform simulation based on the reconfigured processor model 113.

The abstracted architecture model can be considered an architecture graph resulting from modeling actual architecture and a dataflow graph. In the abstracted architecture model, each edge existing on a dataflow graph may be modeled as a queue. For example, the abstracted architecture model may be used to abstract components to which edges of a dataflow graph are mapped, as queues, while maintaining components such as functional units, constant units, and the like, to which nodes of the dataflow graph are mapped in actual architecture. In doing so, interconnection components having little or no influence on operation of applications may be removed and the sequences of interconnection components used to route an operand corresponding to a dataflow edge may be simplified.

As seen from the above-described examples, the method of simulating a reconfigurable processor includes an operation of modeling a processor by representing routing paths between functional units as queues. The modeling may route paths of functional units which produce operands and functional units which consume the operands based on information about routing delays between functional units and stage information of iteration loops according to modulo scheduling received from a scheduler. A simulation of a binary file received from a compiler based on the processor model produced in the processor modeling may be performed and the results of the simulation may be output.

A queue defined in the processor modeling may have a number of slots that corresponds to a ratio of a routing delay on the corresponding routing path and an initiation interval of a stage. In each simulation operation, an operand produced in each functional unit is written in the first slot of the corresponding queue and information written in each slot is shifted to an adjacent slot at each initiation interval. The stage information includes stage division information of an iteration and specific information about the relationship between functional units assigned to individual stages, functional units which produce operands, and functional units which consume the operands.

In addition, the binary file received from the compiler may include a configuration file and an execution file. According to another example, in the simulation operation, simulation may be performed by reading a binary file and executing a host-oriented binary code corresponding to the binary file, extracted from a modeling code DB which stores host-oriented binary codes for operations of routing queues.

The processes, functions, methods, and/or software described above may be recorded, stored, or fixed in one or more computer-readable storage media that includes program instructions to be implemented by a computer to cause a processor to execute or perform the is program instructions. The media may also include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

As a non-exhaustive illustration only, the terminal device described herein may refer to mobile devices such as a cellular phone, a personal digital assistant (PDA), a digital camera, a portable game console, an MP3 player, a portable/personal multimedia player (PMP), a handheld e-book, a portable labtop personal computer (PC), a global positioning system (GPS) navigation, and devices such as a desktop PC, a high definition television (HDTV), an optical disc player, a setup box, and the like, capable of wireless communication or network communication consistent with that disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an is integer greater than 1. Where the computing system or computer is a mobile apparatus, a battery may be additionally provided to supply operation voltage of the computing system or computer.

It should be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A simulator of a reconfigurable processor, the simulator comprising:
one or more processing devices configured to:
produce a processor model comprising a queue that abstractly represents interconnections within the reconfigurable processor between a functional unit producing an operand and a functional unit consuming the operand, the processor model being based on routing delays between functional units and stage information of iteration loops based on modulo scheduling; and
simulate processing of a file received from a compiler based on the processor model, and to output the result of the simulation,
wherein, during simulation, all input buffers of the functional unit consuming the operand are omitted and instead a register file on a route between the functional unit producing the operand and the functional unit consuming the operand is modeled by the queue.

2. The simulator of claim 1, wherein the queue comprises a number of slots corresponding to a ratio of a routing delay on the routing path and an initiation interval of a stage.

3. The simulator of claim 2, wherein the simulating writes an operand produced in each functional unit to a first slot of a corresponding queue, and shifts the information written in each slot to a next slot at each initiation interval.

4. The simulator of claim 1, wherein the file comprises a binary file received from the compiler which includes a configuration file and an execution file.

5. The simulator of claim 1, further comprising a modeling code database (DB) to store host-oriented binary codes for operations of routing queues,
wherein the simulating is performed by reconfiguring interconnections of routing queues from the host-oriented binary codes extracted from the modeling code DB.

6. A simulation method of a reconfigurable processor, the simulation method comprising:
producing a processor model comprising a queue that abstractly represents interconnections within the reconfigurable processor between a functional unit producing an operand and a functional unit consuming the operand, the processor model being based on routing delays between functional units and stage information of iteration loops based on modulo scheduling; and
simulating processing of a file received from a compiler based on the processor model produced by the modeling unit and outputting a result of the simulation,
wherein, during simulation, all input buffers of the functional unit consuming the operand are omitted and instead a register file on a route between the functional unit producing the operand and the functional unit consuming the operand is modeled by the queue.

7. The simulation method of claim 6, wherein the queue represented in the producing of the processor model has a number of slots corresponding to a ratio of a routing delay on the routing path and an initiation interval of a stage.

8. The simulation method of claim 7, wherein the simulating of the file comprises writing an operand produced in each functional unit to a first slot of a corresponding queue and shifting information written in each slot to an adjacent slot at each initiation interval.

9. The simulation method of claim 6, wherein the stage information includes stage division information of an iteration and information about the relationship between functional units assigned to individual stages, functional units which produce operands, and functional units which consume the operands.

10. The simulation method of claim 6, wherein the file comprises a binary file received from the compiler which includes a configuration file and an execution file.

11. The simulation method of claim 6, wherein the simulating of the binary file comprises performing a simulation by reading the binary file, extracting a host-oriented binary code corresponding to the binary file from a modeling code database (DB) which stores host-oriented binary codes for operations of routing queues, and executing the host-oriented binary code.

12. A non-transitory computer-readable storage medium having stored therein program instructions to cause a processor to implement a simulation method of a reconfigurable processor, the simulation method comprising:
producing a processor model comprising a queue that abstractly represents interconnections within the reconfigurable processor between a functional unit producing an operand and a functional unit consuming the operand, wherein the processor model is based on information routing delays between functional units and stage information of iteration loops based on modulo scheduling; and
simulating processing of a file received from a compiler based on the processor model and outputting a result of the simulation,
wherein, during simulation, all input buffers of the functional unit consuming the operand are omitted and instead a register file on a route between the functional unit producing the operand and the functional unit consuming he operand is modeled by the queue.

13. A simulator of a reconfigurable processor, the simulator comprising:
one or more processing devices configured to:
generate an abstracted architecture model that abstractly represents interconnections within the reconfigurable processor between functional units that produce operands and functional units that consume operands, the abstracted architecture model being based on routing delays between functional units and stage information of iteration loops based on modulo scheduling; and
simulate processing of a file based on the abstracted architecture model to output the result of the simulation, wherein, during simulation, all input buffers of the functional unit consuming the operand are omitted and instead a register file on a route between the functional unit producing the operand and the functional unit consuming the operand is modeled by a queue.

14. The simulator of claim 13, wherein the file comprises configuration information that includes information about how functional units of the reconfigurable processor are mapped in order to execute a specific application program.

15. The simulator of claim 13, wherein the file comprises a binary file which includes an execution file that includes instructions that are executed by respective functional units in the reconfigurable processor based on the functional units having a fixed structure during a predetermined time period.

16. The simulator of claim 13, wherein the abstracted architecture model comprises a queue which maps a functional unit that produces an operand to a functional unit that consumes the operand.

17. The simulator of claim 16, wherein a functional unit f1 produces an operand at a time t1, and the queue connects the destination port of the functional unit f1 with the source port of a functional unit f2 that consumes the operand.

18. The simulator of claim 13, wherein the abstracted architecture model is updated based on scheduling information of the functional units, and the scheduling information is received from a scheduler.

19. The simulator of claim 13, wherein the abstracted architecture model represents an abstract routing path between the functional unit producing the operand and the functional unit consuming the operand instead of an actual routing path, and routing delays based on the routing path between the functional unit producing the operand and the functional unit consuming the operand.

20. A reconfigurable processor, comprising:
a plurality of functional units configured to process data;
a processor modeler configured to generate an abstract architecture model that comprises an abstract routing path of an operand between the plurality of functional units instead of representing the routing paths using a sequence of actual interconnections between the plurality of functional units; and
a simulator configured to simulate processing of a file by the plurality of functional units based on the abstracted architecture model,
wherein, during simulation, all input buffers of the functional unit consuming the operand are omitted and instead a register file on a route between the functional unit producing the operand and the functional unit consuming the operand is modeled by a queue.

21. The reconfigurable processor of claim 20, wherein the abstract architecture model represents routing delays based on the interconnections between the plurality of functional units.

* * * * *